United States Patent
Matsuura et al.

(10) Patent No.: US 6,175,186 B1
(45) Date of Patent: Jan. 16, 2001

(54) ORGANIC ELECTROLUMINESCENT ELEMENT AND METHOD FOR MANUFACTURING THE SAME

(75) Inventors: Masahide Matsuura; Mitsuru Eida; Chishio Hosokawa, all of Chiba-ken (JP)

(73) Assignee: Idemitsu Kosan Co., Ltd., Tokyo (JP)

(*) Notice: Under 35 U.S.C. 154(b), the term of this patent shall be extended for 0 days.

(21) Appl. No.: 09/117,286

(22) PCT Filed: Feb. 24, 1997

(86) PCT No.: PCT/JP97/00508

§ 371 Date: Aug. 25, 1998

§ 102(e) Date: Aug. 25, 1998

(87) PCT Pub. No.: WO97/31508

PCT Pub. Date: Aug. 28, 1997

(30) Foreign Application Priority Data

Feb. 26, 1996 (JP) ................................................ 8-038217
Nov. 13, 1996 (JP) ................................................ 8-301678

(51) Int. Cl.[7] ............................................... H01J 1/62
(52) U.S. Cl. .......................................... 313/483; 313/500
(58) Field of Search ........................... 313/498, 500, 313/503, 504, 505, 506, 509, 512, 483

(56) References Cited

U.S. PATENT DOCUMENTS 5,742,129 * 4/1998 Nagayama et al. .................. 313/498
5,804,917 * 9/1998 Takahashi et al. .................. 313/504

FOREIGN PATENT DOCUMENTS

| 196 03 451 | 8/1996 | (DE) . |
| 0 732 868 | 9/1996 | (EP) . |
| 0 767 599 | 4/1997 | (EP) . |

* cited by examiner

Primary Examiner—Nimeshkumar D. Patel
Assistant Examiner—Todd Reed Hopper
(74) Attorney, Agent, or Firm—Oblon, Spivak, McClelland, Maier & Neustadt, P.C.

(57) ABSTRACT

An organic electroluminescent element which is highly precise and minute, uniform in light emission, free from cross talk, resistant to external pressure, and further excellent in sealing properties and a process for producing the above element. The organic electroluminescent element 1 which is equipped, between a lower electrode 3 and a counter eletrode 4 each on a substrate 2, with an intervening organic layer 5 comprising a light-emitting layer, comprises an inter-insulator film 6 having a coefficient of water absorption of at most 0.1% in a non-light-emitting element portion; step portions 9 in the inter-insulator layer 6 which define the boundary between a light-emitting element portion and a non-light-emitting element portion and which comprise rising parts almost perpendicular to the surface of the lower electrode 3; and a sealing plate or a sealing lid 7 which is placed over the inter-insulator layer 6 and which is attached to the substrate 2 via an adhesive layer 8.

31 Claims, 6 Drawing Sheets

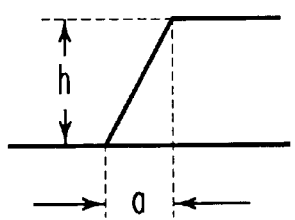 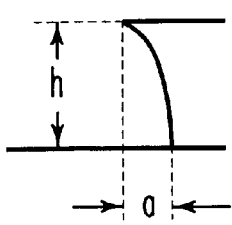 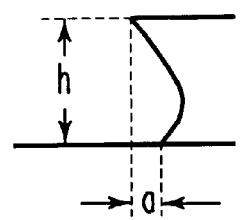
*FIG. 10a*   *FIG. 10b*   *FIG. 10c*
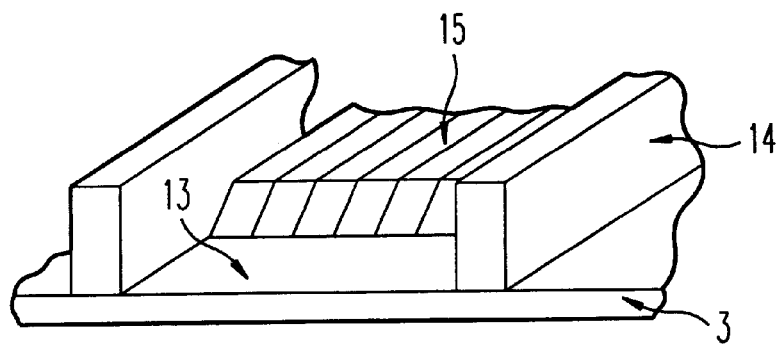
*FIG. 11*
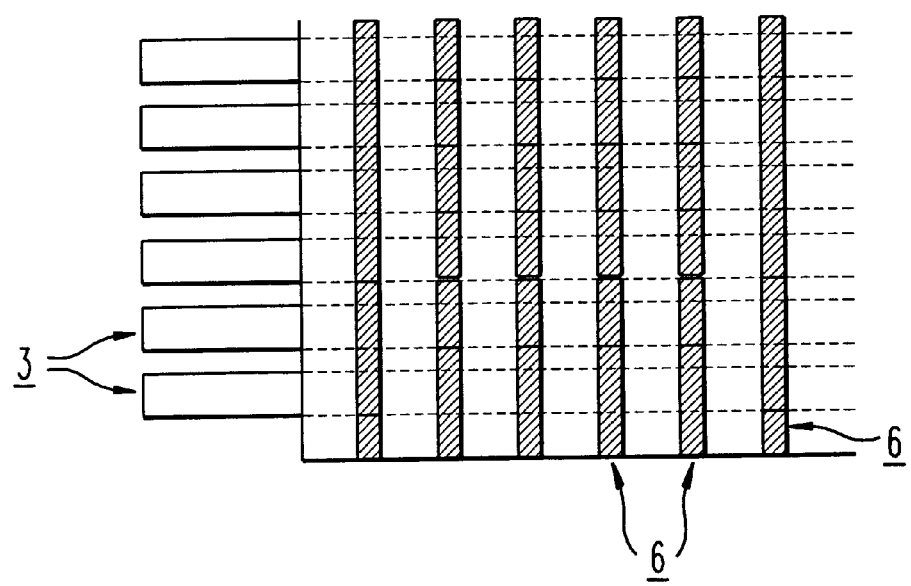
*FIG. 12*

ORGANIC ELECTROLUMINESCENT ELEMENT AND METHOD FOR MANUFACTURING THE SAME

TECHNICAL FIELD

The present invention relates to an organic electroluminescent element. More particularly, the present invention is concerned with an organic electroluminescent element (hereinafter sometimes abbreviated to "organic EL element") which, when used for a display and the like, is highly precise and minute, uniformly emits light, and can withstand external pressure.

BACKGROUND ART

Organic electroluminescent elements have heretofore been developed for use as a display. The organic electroluminescent element to be used as a display is required to have high precision and minuteness in patterning, uniformity in a light-emitting surface and precision in the edge of a light-emitting surface. The organic electroluminescent element is also required to solve such problems by a minute short-circuit occurring at an edge of an electrode, thereby causing cross talk in a display. There is known an element in which a sealing plate is clad to a substrate for the purpose of sealing an organic EL element. The sealing plate has the tendency to be thinner, as a display is required to be thinner, that is, minimized in thickness.

However, a thin sealing plate results in a problem that the sealing plate is brought into contact with an element by impact or external pressure with the result that the plate is destroyed.

Japanese Patent Application Laid-Open No.250583/1991 (Hei-3) discloses an organic EL element which is equipped with an interlaminar insulating film, and thus has favorable pattern precision as well as high uniformity in a light-emitting surface. However, since a masking vapor deposition method is applied to the production of a counter electrode, it has been still difficult to produce a highly precise and minute display having a line pitch of 300 μm or less.

In addition, Japanese Patent Application Laid-Open No.101884/1993 (Hei-5) discloses an organic EL element which is equipped with an inter-insulator layer, and the outside surface of which is covered with a moisture-resistant film. Nevertheless the organic EL element thus disclosed has still a problem that because of the insufficient sealing power of the moisture-resistant film, a cathode is attacked by moisture or oxygen after being allowed to stand for several thousands hours, thus bringing about a dark spot, that is, defective light emission.

Moreover, Japanese Patent Application Laid-Open No. 275172/1993(Hei-5) discloses a highly precise and minute display having a line pitch of about 100 μm, by equipping an organic EL element with an inter-insulator layer in the form of a wall, and also forming a cathode by means of oblique vapor deposition. However, the display disclosed above has still the problem that a minute short circuit is caused by reason of the deviation of the alloy composition in the edges (the end away from the inter-insulator layer) of the electrode that is formed through vapor deposition in an oblique direction to the substrate.

DISCLOSURE OF THE INVENTION

An object of the present invention is to overcome the above-mentioned disadvantages inherent to the conventional techniques, and at the same time, to provide an organic electroluminescent element which is highly precise and minute, capable of uniformly emitting light, free from cross talk, capable of withstanding external pressure, and also excellent in sealing properties.

It has been found that an organic electroluminescent element which is equipped with a vertically rising inter-insulator layer and with a sealing plate above the aforesaid film, is a highly precise and minute display which is free from cross talk, low in production cost, and can be miniaturized and made thinner.

The first aspect of the present invention provides an organic electroluminescent element 1 that is equipped, between a lower electrode 3 and a counter eletrode 4 each on a substrate 2, with an intervening organic layer 5 comprising a light-emitting layer, which element 1 comprises an inter-insulator layer 6 having a coefficient of water absorption of at most 0.1% in a non-light-emitting element portion; step portions 9 in said inter-insulator layer 6 which define the boundary between a light-emitting element portion and a non-light-emitting element portion and which contain rising parts almost perpendicular to the surface of said lower electrode 3; and a sealing plate or a sealing lid 7 which is placed over said inter-insulator layer 6 and which is attached to said substrate 2 via an adhesive layer 8. (Refer to FIG. 1.)

The second aspect of the present invention provides a process for producing an organic electroluminescent element 1, comprising at least one step of forming a lower electrode 3 on a substrate 2; a step of forming a patterned inter-insulator layer 6 on said lower electrode 3; a step of forming an organic layer 5 on said lower electrode 3; and at least one step of forming a counter electrode 4 in the form of film, so that step portions 9 in said inter-insulator layer 6 define the boundary between a light-emitting element portion and a non-light-emitting element portion and also contain rising parts almost perpendicular to the surface of said lower electrode 3, said counter electrode 4 is cut off by said step portions 9 at the rising parts so as to be subjected to patterning processing, and said counter electrode 4 is in close contact with said inter-insulator layer 6 at said step portions 9 adjacent to said substrate 2.

The third aspect of the present invention provides an organic electroluminescent element 1 that is equipped, between a lower electrode 3 and a counter eletrode 4 each on a substrate 2, with an intervening organic layer 5 comprising a light-emitting layer, which element 1 comprises an inter-insulator layer 6 having a coefficient of water absorption of at most 0.1% in a non-light-emitting element portion; step portions 9 in said inter-insulator layer 6 which contain portions rising in the form of an inverse taper almost perpendicularly to the surface of the lower electrode 3 and divide said counter electrode 4 into a plurality of individuals; and a sealing plate or a sealing lid 7 which is placed over said inter-insulator layer 6 and which is attached to said substrate 2 via an adhesive layer 8.

The fourth aspect of the present invention provides an organic electroluminescent element 1 that is equipped, between a lower electrode 3 and a counter eletrode 4 each on a substrate 2, with an intervening organic layer 5 comprising a light-emitting layer, which element 1 comprises a first inter-insulator layer having a trapezoidal cross section 15 on said lower elecrode 3 as a non-light-emitting element portion; a second inter-insulator layer 14 above said trapezoidal cross section (on the opposite side of said lower electrode 3) ; step portions 9 in said second inter-insulator layer 14 which contain rising parts almost perpendicular to the surface of the lower electrode 3 and divide said counter electrode 4 into a plurality of individuals; and a sealing plate or a sealing lid 7 which is placed over said second inter-insulator layer 14 and which is attached to said substrate 2 via an adhesive layer 8. (Refer to FIG. 2.

The fifth aspect of the present invention provides a process for producing an organic electroluminescent element 1, comprising at least one step of forming a lower electrode 3 on a substrate 2; a step of forming a patterned inter-insulator layer on said lower electrode 3; a step of forming an organic layer over said lower electrode 3; and at least one step of forming a counter electrode 4 in the form of film so that a first inter-insulator layer 15 has a trapezoidal cross section, a second inter-insulator layer 14 is mounted above said trapezoidal cross ( section on the opposite side of said lower electrode 3 ), step portions 9 in said second inter-insulator layer 14 contain rising parts almost perpendicular to the surface of said lower electrode 3, and said counter electrode 4 is subjected to patterning processing at said rising portions.

BRIEF DESCRIPTION OF THE DRAWINGS

FIG. 10 is a view showing a cross-sectional configuration of an inter-insulator layer;

FIG. 11 is a stereograph at the time of forming two layers of inter-insulator layer;

FIG. 12 is a view when an X-Y matrix is observed from upside;

Figure 1:
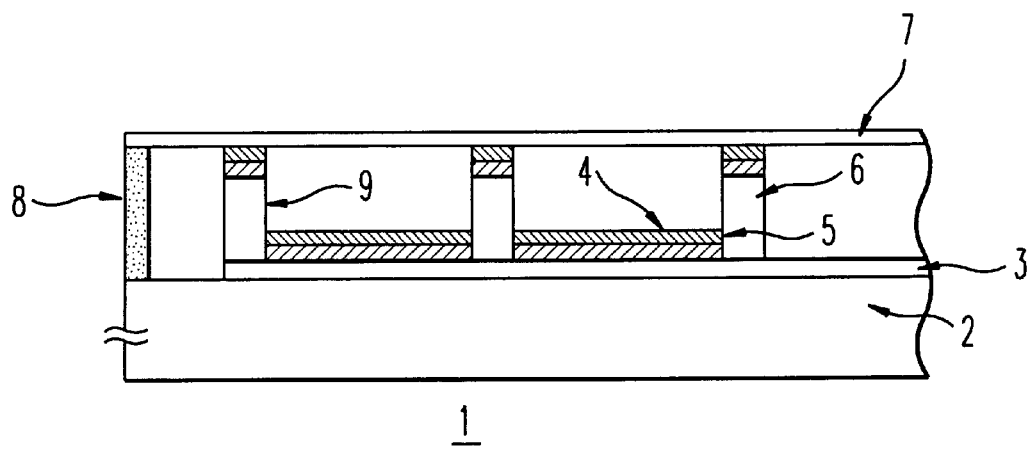
FIG. 1. is a cross-sectional view showing an organic EL element according to the first aspect of the present invention.

The symbols in the above-mentioned drawings shall have the following designation.

1. organic EL element
2. substrate
3. lower electrode
4. counter electrode
5. organic layer
6. inter-insulator layer
7. sealing plate
8. adhesive layer
9. step portion
10. edge of counter electrode
11. photoresist subjected to patterning processing
12. etching portion
13. opening portion
14. second inter-insulator layer
15. first inter-insulator layer
20. SCAN electrode wire
21. DATA electrode wire
22. COMMON electrode wire
23. capacitor
24. pixel electrode
25. opening for inter-insulator layer

THE MOST PREFERRED EMBODIMENTS TO CARRY OUT THE INVENTION

In the following, the present invention will be described in more detail.

First of all, some description will be given of the inter-insulator layer which constitutes the organic electroluminescent element according to the present invention.

An organic electroluminescent element is known in which an organic layer allowing current to flow is made to intervene between a pair of a lower electrode and a counter electrode. A portion in which an insulator layer is made to intervene between a lower electrode and a counter electrode prevents current from flowing, and accordingly can not emit light. Thus said portion constitutes a non-light-emitting portion. Such an insulator layer is designated as inter-insulator layer. A technique is known, which carries out pattern processing of a light emitting element by the pattern processing of an inter-insulator layer [note to Japanese Patent Application Laid-Open No.250583/1991(Hei-3)].

Figure 3:
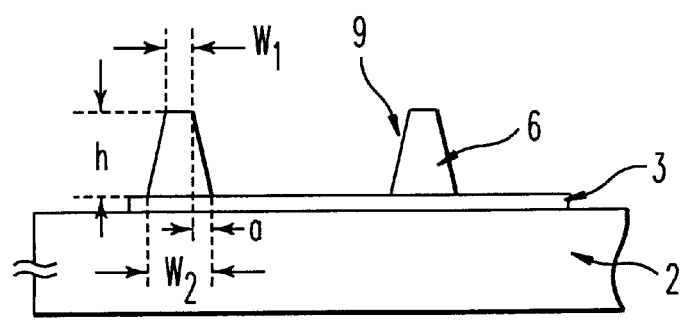
FIG. 3 is a cross-sectional view showing an inter-insulator layer on a substrate.

It is indispensable in the present invention that step portions of an inter-insulator layer rise almost perpendicularly, said step portions being positioned at a boundary separating a non-light-emitting element portion equipped with an inter-insulator layer from a non-light-emitting element portion not equipped with an inter-insulator layer. By using "h" for the height of an inter-insulator layer, "$W_1$" for the width of the top part of the inter-insulator layer, and "$W_2$" for the width of the bottom part of the inter-insulator layer, the configuration of the inter-insulator layer in FIG. 3 is expressed by the following formula:

$$a \approx \frac{W_2 - W_1}{2}$$

In the present invention, a<(h/7) is preferable, and a<(h/10) is particularly preferable. It is made to a<0 when the step portions are processed to form an inversely tapered shape, which is one of the most preferable configurations in the present invention. The height of an inter-insulator layer (h) is preferably in the range of 0.5 m$\mu$ to 50 m$\mu$. The height of an inter-insulator layer (h), when being in the aforestated range, enables a counter electrode 4 to be cut off at the step portions of the inter-insulator layer and at the same time, to be subjected to patterning processing.

There has heretofore been known a technique of pattern processing a counter electrode by applying vapor deposition in an oblique direction to form the counter electrode

Figure 4:
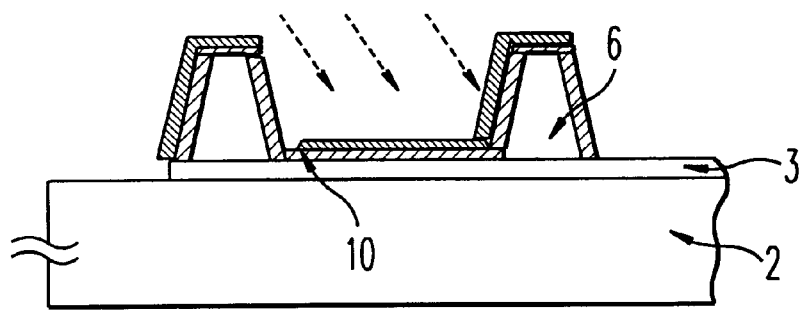
FIG. 4 is a cross-sectional view showing a counter electrode at the time of vapor deposition in an oblique direction to the substrate.

[Japanese Patent Laid-Open No. 275172/1993(Hei-5), in particular], since it has been impossible to form such a rising step portion. The foregoing vapor deposition technique, which applies vapor deposition in an oblique direction to the inter-insulator layer in order to form the counter electrode, has involved the problems that an edge of the counter electrode 4 is formed as shown in FIG. 4 and thus a short circuit and nonuniformity of light emission are liable to take place at the edge portion 10. In addition, the foregoing technique has involved the problem that the processablity of a minute pattern is lessened by the decrease in the pattern precision due to the deposition passing around at the time of vapor deposition.

Figure 5:
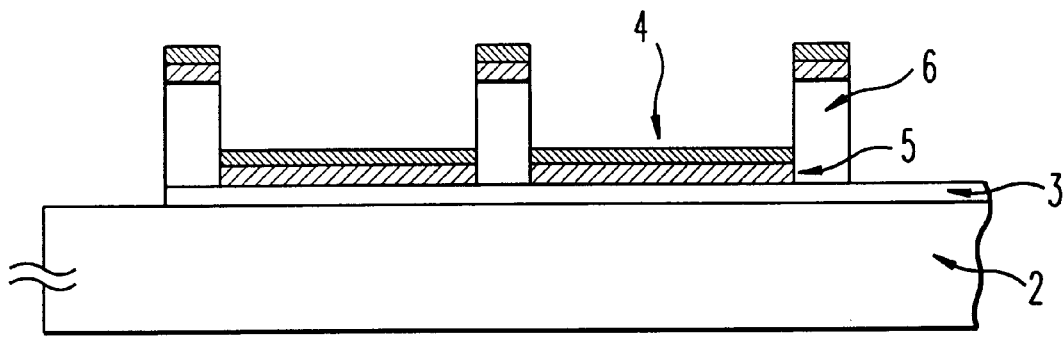
FIG. 5 is a cross-sectional view showing a counter electrode after vapor deposition in the present invention.

As opposed to the aforestated conventional technique, since the step portions 9 of the inter-insulator layer rise almost perpendicular, it is made possible thereby to spontaneously cut off the counter electrode at the step portion 9, and thus to pattern process the counter electrode by dispensing with a special method such as the oblique vapor deposition. In the first and the second aspects of the present invention, the counter electrode 4 of the light-emitting element portion is in contact with the cross section of the adjacent inter-insulator layer 6 at the pattern processed portion. The first and second aspects of the present invention are each characterized by the absence of a counter electrode 4 which is apart from said cross section, whereby the advantages of the present invention are derived (FIG. 5). In the following, the working effects due to the above advantages will be described.

(a) The pattern precision is surprisingly excellent enabling even several $\mu$m of precision, since the pattern of the counter electrode 4 is determined by the pattern of the interlaminar insulating film 6 as such.

(b) The light emission is freed from non-uniformity, since the counter electrode 4 is freed from compositional non-uniformity or productive non-uniformity at the edge of the counter electrode 4. It has been made possible to prevent non-uniformity from occurring in the electric field, and also to prevent short circuit as well as cross talk. In addition, it is advantageous that the edge of the light-emitting element portion of the counter electrode 4 is less prone to be oxidized, since it is in contact with the inter-insulator layer.

(c) Since the patterning of the inter-insulator layer 6 itself is possible even with a precision of 1 $\mu$m by the use of photolithography method, the patterning precision of the counter electrode 4 is enhanced, and the highly precise minute patterning of the counter electrode 4 is also made possible. The patterning is favorably applicable to the use requiring a high resolution display, a printer head and the like in order to realize several $\mu$m of the pitch.

Figure 6:
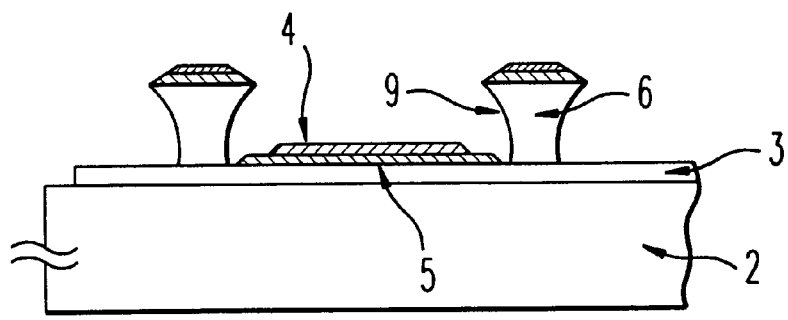
FIG. 6 is a cross-sectional view showing an inter-insulator layer etc. according to the third aspect of the present invention.

Likewise in the third aspect of the present invention, it is possible to cut off the counter electrode 4 at the step portion 9 and to process patterning of the same. In the case of inversely tapered shape, even for the presence of bending around of vapor deposition, the deposits are prevented from adhering to the step portion, thereby enabling more reliable cutting off. The advantages in the third aspect of the present invention are same as the description in the items (a) and (b), thereby enabling high resolution and high density patterning of the cathode. However in the third aspect of the present invention, as shown in FIG. 6, the counter electrode 4 must not entirely cover the organic layer 5, or cause short circuits to the lower electrode 3.

Figure 2:
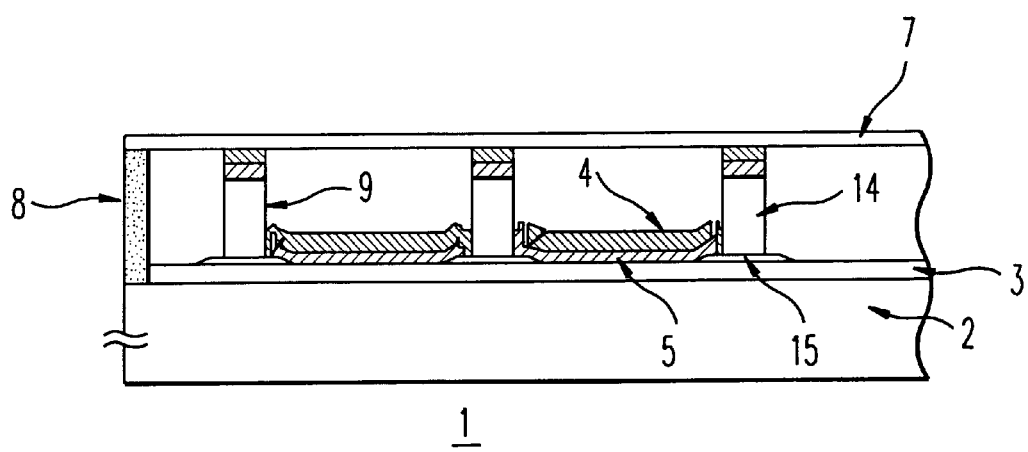
FIG. 2 is a cross-sectional view showing an organic EL element according to the fourth aspect of the present invention.

In the fourth and fifth aspects of the present invention, as shown in FIG. 2, the light-emitting pattern is established by installing the first inter-insulator layer 15, and at the same time, the counter electrode 4 is pattern processed with the second inter-insulator layer 14 rising almost perpendicular. The reason for using the first inter-insulator layer 15 is directed to the prevention of electric current flow even in the case of poor adhesion between the second inter-insulator layer 14 and the edge of the counter electrode, by definitely eliminating a malfunctioning portion such as short circuits occurring at the edge.

By virtue of the aforesaid constitution, the foregoing effects (a), (b), and (c) are assured. Moreover, the second inter-insulator layer 14 may be inversely tapered, or may be such that satisfying the inequality a<(h/10).

The materials of construction for the inter-insulator layer to be used in the present invention need to be the materials which enable highly precise and minute patterning. Preferably usable specific examples thereof include a variety of insulating polymers, insulating oxides, insulating nitrides and insulating sulfides. Examples of particularly preferable polymers include fluorinated polyimides, polyolefin, fluorine-based polymers and polyquinoline. Examples of particularly preferable oxides include $SiO_x(1<x<2)$, $SiO_2$, fluorine-added $SiO_2$ and $Al_2O_3$. Examples of preferable nitrides include $SiN_y(1<y<4/3)$, SiON and AlSiON. Examples of preferable sulfides include ZnS.

An inter-insulator layer of low hygroscopicity is preferably used in addition to that of insulating property. Particularly preferable inter-insulator layer 6 is are having a water absorption (coefficient of water absorption) of at most 0.1%. An inter-insulator layer of high hygroscopicity causes, in the case of preserving the elements, oozing out of water which has mixed in during the preparation, thereby oxidizes the electrode of the element, deteriorates the element and further becomes responsible for defects in light emitting elements (dark spot). The use of a polymer of low hygroscopicity is preferable because of, in particular its excellent processability. Particularly preferable inter-insulator layer is that of fluorine base or polyolefin base. The hygroscopicity is evaluated as coefficient of water absorption according to ASTM D-570.

The inter-insulator layer is not necessarily required to have a photosensitive function, but preferably has such a function in some cases, since said function enables photolithography without the use of a photoresist. A photosensitive material is available in the market whether it is an inorganic oxide or a polymer.

In the following, detailed description will be given of the film preparation process for the inter-insulator layer as well as the patterning process. From among a variety of film preparation processes and patterning processes that are available in the present invention, typical examples by the use of photolithography will be described hereunder.

(i) Film Preparation for the Inter-insulator Layer.

Figure 7:
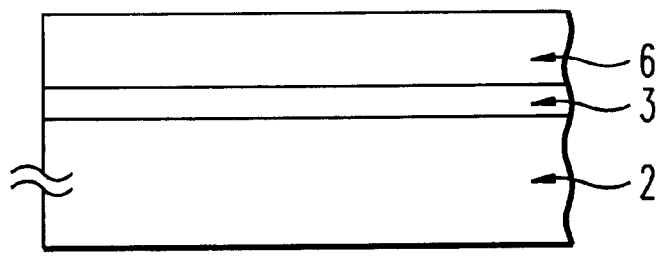
FIG. 7 is a cross-sectional view showing an inter-insulator layer at the time of its film forming.

In the case of an insulative polymer, a solution of a polymer or a precursor thereof is made into a film by means of coating, spin coating, dipping or the like process (refer to FIG. 7) In the case of an insulative inorganic oxide, a variety of film preparation processes are available including vapor deposition, CVD, plasma CVD, ECR-CVD, sputtering, ECR-sputtering and the like processes.

(ii) Photosensitization and Development of Photoresist.

Figure 8:
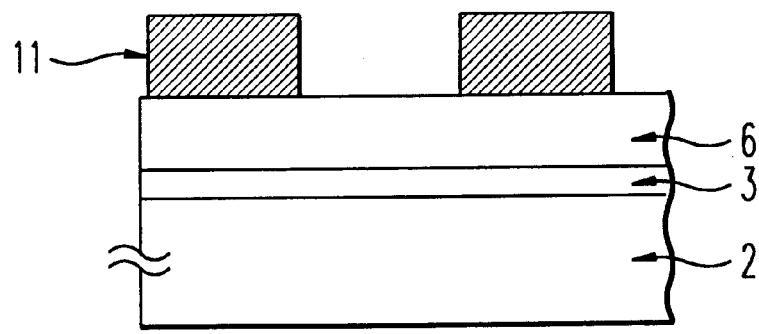
FIG. 8 is a cross-sectional view showing a photoresist after patterning.

The patterning of a photoresist is carried out by photosensitizing any of various available photoresists, and developing the same (refer to FIG. 8). A photoresist and an exposure method are each selected in accordance with the minuteness and precision of the pattern that are required in each case. Various exposure methods are known and exemplified by contact exposure method and cutback exposure method.

(iii) Patterning Step.

Figure 9:
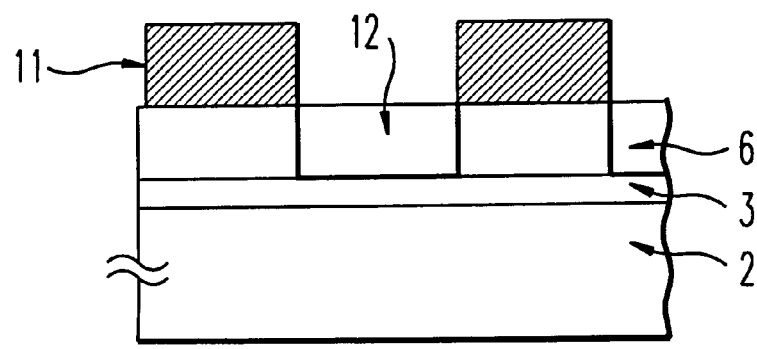
FIG. 9 is a cross-sectional view showing etching process in a patterning step.

A portion uncovered with a photoresist is removed by any of various etching methods (refer to FIG. 9). Examples of the etching methods include wet etching method in which an inter-insulator layer is dissolved and removed with a solvent and dry etching method in which an inter-insulator layer is decomposed and removed with a plasma or the like. In order to allow an inter-insulator to rise almost perpendicular to the surface of the lower electrode 3, the dry etching method is preferable.

In the case of using the wet etching method, it is necessary to employ a solvent having a high etching rate for the inter-insulator layer in the direction perpendicular to the substrate. In the case where such a solvent is available for any of a variety of inter-insulator layers, the use of the wet etching method is preferable from the viewpoint of reducing the production cost and enhancing the productivity.

In the case of using the dry etching method, it is important to select a suitable etching gas. Dry etching by the use of oxygen plasma is preferable for such a polymer as fluorinated polyimides, polyolefins and polyquinolines. On the other hand for fluorine-based polymers, fluorine-added $SiO_2$, $SiO_2$ and $Al_2O_3$, it is preferable to employ, as a etching gas, a fluorinated carbonized gas which has been made into a radical form with a plasma. Examples of particularly preferable fluorinated carbonized gas include $CHF_3$ and $CF_4$. It is also preferable to employ a halogenated boron gas or a fluorinated carbonized gas that is mixed with oxygen, argon or the like.

By the above-mentioned procedures, the preparation steps of the inter-insulator layer can be completed. There is available, however, another film preparation process, for example, a process in which an oxide-mixed paste is made into a film and patterned by means of a screen printing method or the like, and thereafter the resultant patterned film is fired at several hundreds centigrade to prepare an inter-insulator layer.

In the following, some description will be given of the counter electrode and the process for producing the same as well as a sealing plate.

A counter electrode 4, when being used as a cathode, is preferably made of an alloy containing an alkali metal or an alloy containing an alkaline earth metal. Examples of particularly preferable alloys among them include Mg:Ag, Al:Li, Pb:Li, Zn:Li, Bi:Li, Ln:Li, Al:Ca, etc. It is known that the above-exemplified alloys are relatively corrosion-resistant and have each a low work function.

In the preparation of films by using said alloy, a vapor deposition method and a sputtering method, especially the sputtering method are preferably used. There is no need at all in the present invention, for carrying out oblique vapor deposition. On the contrary in order to assure the organic EL element according to the present invention, the vapor deposition should be carried out perpendicularly to the surface of a substrate.

A counter electrode 4, when being used as an anode, is preferably made of a transparent oxide. Examples of particularly preferable oxide include ITO, ZnO:Al, $SnO_2$: Sb and InZnO(indium/zinc oxide).

In the organic EL element according to the present invention, a sealing plate is positioned over the inter-insulator layer 6 or the second inter-insulator layer 14. Preferable materials of construction for the sealing plate or sealing lid are glass, an oxide and a nitride ceramic each in the form of a thin plate. Preferable thickness of the sealing plate or sealing lid is 5 µm to 2 mm, and it is at most 500 µm in order to obtain particularly thin organic EL element.

It has heretofore been a problem that when a thin sealing plate is used, it is brought into contact with the body portion of the organic EL element by the external pressure or impact, thus leading to the breakage of the organic EL element. With regard to the present invention, however, the inter-insulator layer 6 or the second inter-insulator layer 14 functions as a column, and prevents the sealing plate from coming into contact with the body of the organic EL element. It is therefore, made possible to make thinner the whole organic EL element by thinning the sealing plate 7, without causing any problem even if the sealing plate 7 is made as thin as 50 µm.

In the following, detailed description will be given of the preferred embodiments of the present invention.

First of all, the preferred embodiments of the sealing plate are as follows.

(a) The space encompassed by the sealing plate 7 and the substrate 2 is filled in with a fluorinated hydrocarbon as a sealing liquid to promote the heat radiation properties and at the same time, enhance the sealing characteristics.

(b) The space encompassed by the sealing plate 7 and the substrate 2 is incorporated with a moisture absorbing agent preferably exemplified by zeolite, silica, calcined gypsum and calcium carbonate.

(c) A moisture absorbing layer is placed on the inner side (instead of the outer side which is in contact with the outside of the organic EL element) of the sealing plate 7. Examples of the moisture absorbing layer include not only a layer of a moisture absorbing polymer, a layer of the mixture of a moisture absorbing polymer and a moisture absorbing agent, but also a layer in which a moisture absorbing agent is fixed on the inner side of the sealing plate by means of a resin which has been cured by ultraviolet ray or heat. Examples of the moisture absorbing polymer include polyamide, polyvinyl alcohol and polyvinyl butyral.

(d) The space encompassed by the sealing plate 7 and the substrate 2 is preferably incorporated with a sealing gas such as dehydrated nitrogen, carbon dioxide or helium.

(e) It is possible to enhance the color purity of light emission or contrast by placing a color filter on the sealing plate at the time of withdrawing light from the counter electrode.

(f) Likewise, it is possible to enhance the color purity of light emission or contrast by placing a color filter in the sealing plate and above the counter electrode at the time of withdrawing light from the counter electrode.

(g) Further it is possible to convert the color of emitted light by placing a color conversion film in the sealing plate and above the counter electrode. A color can be converted from blue to red or orange, from green to red or orange, from blue to green or white and so forth. The color conversion film has been subjected to patterning, and there are separately available in parallel, films which convert to green, and red, respectivly.

The cross sectional configurations of the inter-insulator layer 6 and the second inter-insulator layer 14 in the present invention include three embodiments (a), (b), (c) and the like as shown almost against the substrate surface in FIG. 10. It is preferable in the present invention that the relationship $|a|<(h/7)$ is satisfied. The embodiment (b) or (c) corresponds to the case of a<0, and is characterized in that the cross section is processed in the inversely tapered shape, thus rendering itself one of the preferable embodiments. The reason is that the counter electrode 4 under the above-mentioned embodiment is cut off without fail at step portions.

There exist step portions of the inter-insulator layer in the present invention, but it is possible to form portions where the counter electrode 4 is not cut off. As an example, when a taper of a>(h/5) is processed at the step portion 9, there is no need for cutting the counter electrode.

As illustrated in FIG. 11, a portion that is encompassed by a rising cross-section and a taper cross-section, can be formed at the opening of the inter-insulator layer which constitute the light emitting element portion by a method wherein two layers of the inter-insulator layers are formed, specifically, by allowing a first step portion of the film to rise perpendicularly and subjecting a second step portion of the film to taper processing. The counter electrode is cut off at the rising portion, but is not cut off at the taper cross-section.

The fourth and the fifth aspects of the present invention take advantage of the foregoing facts. That is to say, at the first inter-insulator layer 15, the cross section is formed into a trapezoidal shape so that the counter electrode may not be cut off and so that the film is used for establishing the light-emitting pixel surface. On the contrary, at the second inter-insulator layer 14, the step portions are made to rise almost perpendicularly so that the counter electrode may be cut off and so as to enable patterning by taking advantage of the layer.

It is also possible in the present invention to apply vapor deposition masking so that a counter electrode 4 may not be formed on the inter-insulator layer [note Japanese Patent Application Laid-Open No.250583/1991(Hei-3)]. Accordingly, a portion free from a counter electrode 4 can be formed on the inter-insulator layer.

The above-mentioned present invention is preferably usable as the embodiments as described hereunder.

(i) It is possible in the present invention to form a large number of lower electrodes 3 in the form of parallel stripe type electrodes, and further to form a large number of inter-insulator layer of the present invention in the form of stripes that are perpendicular to the aforesaid stripes. By applying the invention to this embodiment, an X-Y type matrix can be formed.

Figure 13:
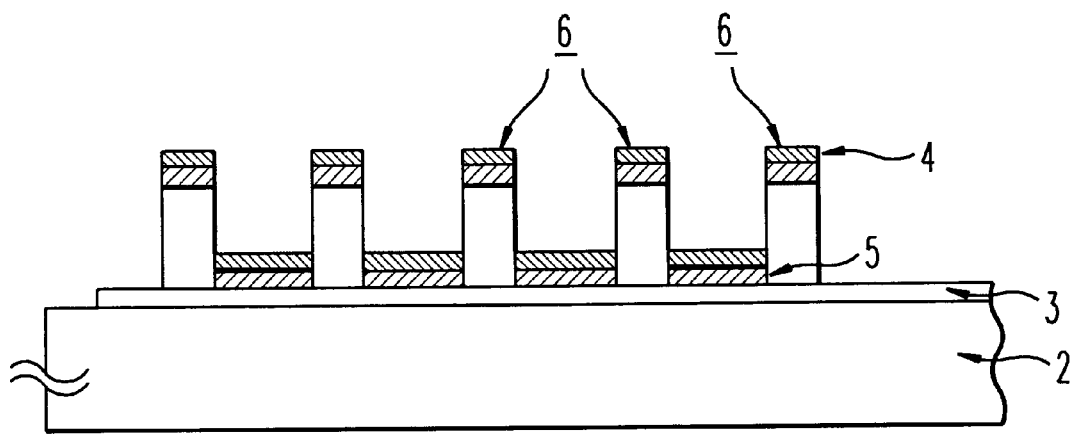
FIG. 13 is a cross-sectional view showing an X-Y matrix.

FIG. 12 is a view when such an X-Y type matrix is observed from upside, and FIG. 13 is a cross sectional view of this X-Y type matrix.

(ii) It is not necessary to form the X-Y type matrix as described in the preceding item (i) in the case of TFT driving or active matrix driving, but in any case like this it is made possible to use the organic EL element according to the present invention.

Figure 14:
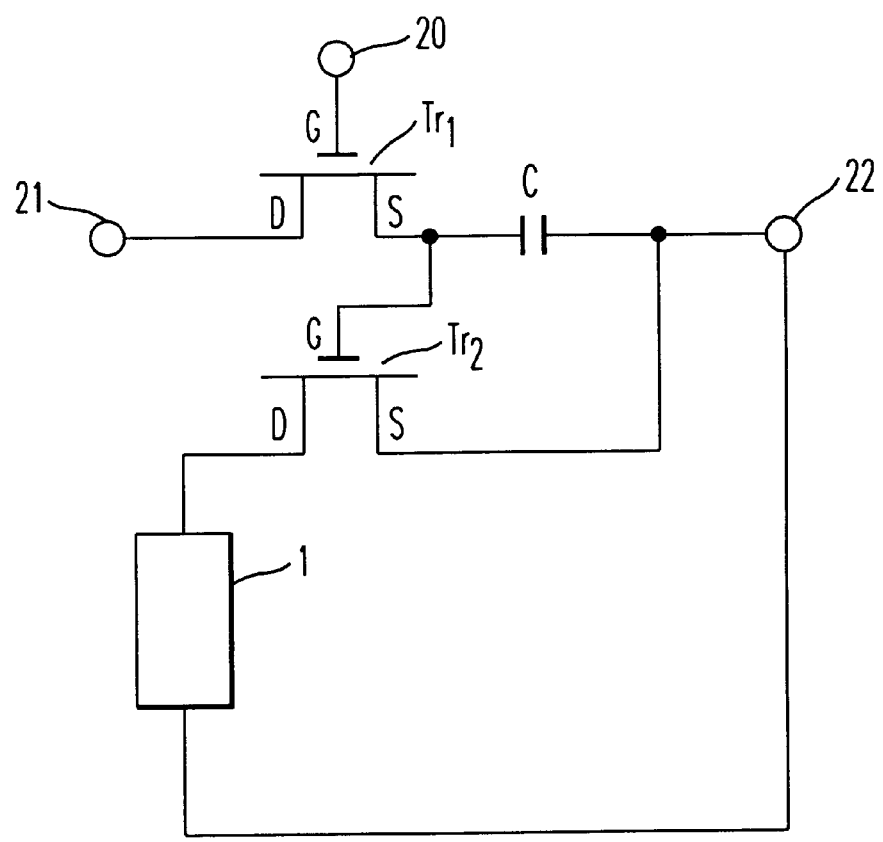
FIG. 14 is a circuit diagram at the time of driving an active matrix.
Figure 15:
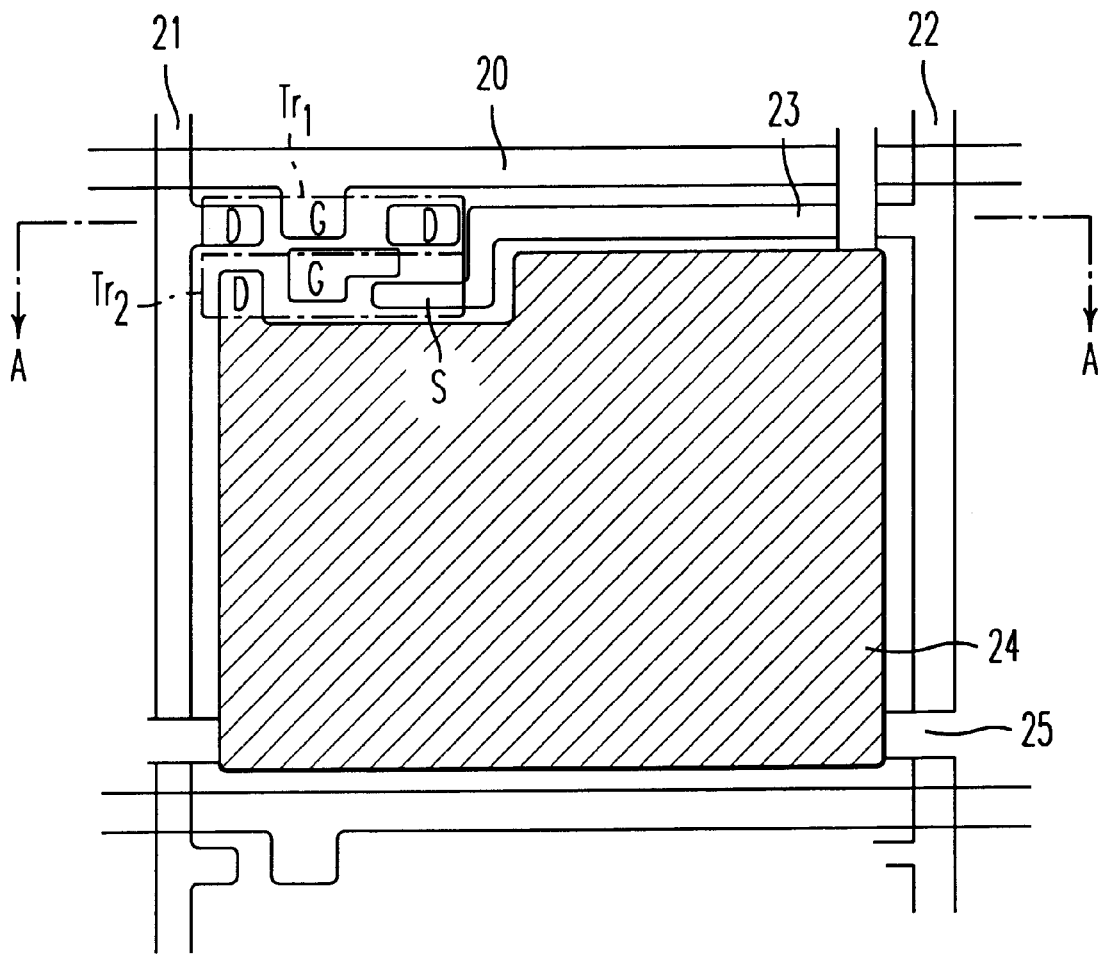
FIG. 15 is a plan view showing an example at the time of driving an active matrix.

As an example, the circuit as illustrated in FIG. 14 is incorporated per each pixel in active matrix driving using a transistor. In the constitution of the circuit arrangement in FIG. 15, if opening portions of the inter-insulator layer according to the present invention are provided only at the end portion 25 and the portion corresponding to the pixel electrode, it follows that the counter electrodes $Tr_1$ and $Tr_2$, the counter electrodes on SCAN( 20 ), DATA( 21 ), and COMMON( 22 ) and the counter electrode on the pixel electrode are insulated by the step portions of the inter-insulator layer.

It is therefore, made possible to avoid the electrical communication of $Tr_1$, $Tr_2$, SCAN, DATA, and COMMON with the counter electrode 4 on the pixel electrode, by passing electric current only through the counter electrode 4 on the pixel electrode. Pixel defects have heretofore been frequently caused by the electrical communication of $Tr_1$, $Tr_2$, SCAN, DATA, and COMMON with the counter electrode owing to the defect of the inter-insulator layer. However such a malfunctioning can be avoided by said constitution.

Moreover, an additional inter-insulator layer is installed in advance on the portion at which the SCAN, DATA, and COMMON intersect the counter electrode 4, on the portion at which the COMMON intersects the SCAN, and also on the portion at which the SCAN intersects the DATA so as to insulate one another. The above-mentioned additional inter-insulator layer, different from the inter-insulator layer according to the present invention, are not equipped with perpendicular step portions so that the electrode wires above the additional inter-insulator layer may not be cut off. Accordingly, it is acceptable in the present invention to partially use an inter-insulator layer having non-perpendicular step portions.

In the following, the present invention will be described in more detail with reference to working examples, which however, shall not limit the present invention thereto.

EXAMPLE 1

Preparation of Inter-Insulator Layer

ZCOAT-1410 (photosensitive polyolefin-based nagative type resist, produced by Nippon Zeon Co.,Ltd.) was used to form a film by spin coating on a glass substrate 2 having a thickness of 0.5 mm and holding an ITO as a lower electrode which had been subjected to striped processing at a pitch of 300 μm. The spin coating was carried out at a number of revolutions of 1500 rpm for a revolution time of 35 seconds. The film obtained in the aforesaid manner had a thickness of 5.3 μm. Subsequently, the film-coated substrate was baked in a hot oven at 70° C. for 30 mimutes, and then was exposed to light through a photomask at an irradiation power of 120 mJ/cm² with ultraviolet ray at a wavelength of 436 nm. The exposure pattern was carried out so that the ZCOAT-1410 as the inter-insulator layer having a width of 20 μm remained at every 100 μm as linear lines perpendicularly to the pattern of the aforesasid ITO pattern. After development, curing was put into practice at 250° C. for 2 hours in a clean oven to prepare an inter-insulator layer.

EXAMPLE 2

Evaluations for Perpendicularity of Inter-Insulator Layer and Moisture Absorption Property The specimen that had been prepared in the preceding Example 1 was broken at an arbitrary point thereof into ten specimens sized 2 mm×2 mm, the cross sections of which were observed by the use of a scanning electron microscopy. Thus, measurements were performed to obtain the value: {(width of the lower section)−(width of the upper section)}/(height) at 20 places of the specimens. As a result, the value was 1/10 or less for all of the specimens. At the same time, measurements were performed to obtain the coefficient of water absorption (moisture absorption) of the specimen which had been prepared in Example 1. As a result, the the moisture absorption showed favorable values of 0.07% (in accordance with ASTM D 570).

EXAMPLE 3

Preparation of Organic EL Element and Evaluation of Precision and Minuteness Thereof The specimen which had been prepared in Example 1 was cleaned with ultrasonic wave in isopropyl alcohol for 3 minutes, and further with a cleaning apparatus using the combination of ultraviolet ray and ozone for 30 minutes. Subsequently, the specimen was placed in a vacuum deposition apparatus available from the market (produced by ULVAC JAPAN Ltd.), and was fixed to a substrate holder.

Then 200 mg of N, N'-diphenyl-N, N'-bis-(3-methylphenyl)-[1, 1'-biphenyl]-4, 4'-diamine (hereinafter abbreviated to "TPD") was placed in a resistance heating boat made of molybdenum, and in another resistance heating boat made of molybdenum was placed 200 mg of tris (8-hydroxyquinolinol)aluminum (hereinafter abbreviated to "Alq"). Subsequently, a vacuum chamber containig the boats was evacuated to $1 \times 10^{-4}$ Pa.

Thereafter, the TPD-containig boat was heated to form a hole transporting layer having a film thickness of 80 nm. Without taking out the boat out of the vacuum chamber, there was prepared a light-emitting layer in the form of film consisting of Alq and having a film thickness of 75 nm on the hole transporting layer. Subsequently, without opening the vacuum chamber, Mg and a tungsten basket containing silver that were placed in a resistance heating boat and prepared in advance in a vaccum chamber, were heated to prepare a film of Mg-Ag counter electrode having a film thickness of 200 nm at vapor deposition rates of Mg and Ag of 1.4 nm/sec. and 0.1 nm/sec., respectivly. By the above-described procedures an organic EL element prior to sealing was completed.

Thereafter, a sealing plate was adhesively bonded onto the resultant organic EL element in an inert gas ($N_2$). The sealing plate used herein was a glass plate with a thickness of 100 μm which had been subjected to dehydration treatment by the use of a dehydrating agent which had been prepared by dispersing silica-gel in a solution of soluble nylon. By defining the surface to which the dehydrating agent attached as the element side, the periphery of the sealing plate was coated with a ultraviolet ray curing adhesive, and the sealing plate and the organic EL element were attached to each other to seal them by ultraviolet ray irradiation. As the result, a sealed organic EL element according to the present invention was completed. The resultant sealed organic EL element had a thickness as small as 0.6 mm, thus demonstrating the effffectiveness of the organic EL element according to the present invention as described hereinbefore.

Subsequently by selecting one line of ITO and one line of Mg:Ag out of the stripe lines, a voltage of 7 V was applied using ITO as the anode and Mg:Ag as the cathode to examine the precision of the pattern by the use of an optical microscope. As a result, the precision of the pattern was remarkably favorable, showing ±1 μm, and only the intersecting part of the stripes of the ITO and the Mg:Ag emitted light.

In addition, voltage was applied to all stripe lines of the Mg:Ag to examine the function of the pattern. As a result, it has been confirmed that the pattern was free from any short-circuited connection part, thereby demonstrating the favorable patterning of the counter electrode of the organic EL element according to the present invention. It has been confirmed that the organic EI element, even when preserved in the air at 20° C. and 60% RH for 5000 hours, was free from a defect in light emitting element of 50 μm or larger in diameter, and was excellent in sealing propeties.

Moreover, the non-light-emission state for the edges of the stripe lines was examined at the same time. As the result, it has been confirmed that the non-light-emission width thereof was 3 μm or smaller, and also that the edges were favorably defined.

Further the sealing plate was pressed with fingers to check any short-circuits of the element. As the result, the element was entirely free from any short-circuits, since the inter-insulator layer was in the form of a column.

COMPARATIVE EXAMPLE 1

A photosensitive polyimide coating material (produced by Toray Industries Inc. under the trade name "UR 3140") was applied by spin coating onto a glass substrate holding an ITO as the lower electrode which had been subjected to striped processing, said glass substrate being the same as that used in Example 1. The spin coating was carried out at a number of revolutions of 4000 rpm for a revolution time of 30 seconds. Subsequently, the coated substrate was dried at 80° C. for 30 mimutes, and then was exposed to light through a photomask at an irradiation power of 80 mJ/cm².

By the subsequent development, a pattern of the polymer of a polyamic acid was obtained. The resultant pattern was cured at 180° C. for 30 minutes in an oven in an $N_2$ atmosphere, and further cured at 300° C. for 30 minutes, thus enabling to prepare an ITO/glass substrate with a polyimide layer as an inter-insulator layer. Thereafter the resultant ITO/glass substrate was tesed in the same manner as in Example 2. As a result, the value: {(width of the lower section)–(width of the upper section)}/(height) was about 1. Then in the same manner as in Example 3, an organic EL element was prepared, and one line of ITO and one line of Mg:Ag were selected out of the stripe lines. A voltage was applied thereto using ITO as the anode and Mg:Ag as the cathode. As a result, it has been confirmed that there existed light-emitting portions in addition to the intersecting part of the stripes of the ITO and the Mg:Ag, and that the striped pattern processing of the Mg:Ag as the counter electrode was unsuccessful under the foregoing conditions. The specimen after sealing was allowed to stand in the atmosphere at 20° C. and 60% RH. As the result, the light-emitting surface was markedly decreased. This fact is due to that because of the high moisture-absorption (usually 1 to 2%) of the polyimide as the inter-insulator layer, the inter-insulator layer absorbs moisture, and after sealing, the moisture which has been absorbed in the polyimide is released therefrom, thus oxidizing the Mg:Ag as the counter electrode.

EXAMPLE 4

In the Case of the Inter-Insulator Layer Being a Fluorine-Based Polymer

A solution of a fluorine-based resin (produced by Asahi Glass Co.,Ltd. under the trade name "Sitop CTX-809") capable of forming an inter-insulator layer made of a fluorine-based resin having a coefficient of water absorption of at most 0.01% (in accordance with ASTM D570) was applied by spin coating onto a glass substrate same as that used in Example 1. The spin coating was carried out at a number of revolutions of 600 rpm for a revolution time of 30 seconds to form a Sitop film with a film thickness of 4.8 μm. Then, the coated substrate was dried on a hot plate at 50° C. for 1 minute, at 80° C. for 1 mimute, and at 120° C. for 1 mimute. As the final curing it was further dried in an oven at 250° C. for 1 hour.

Subsequently, a positive type photoresist (produced by Tokyo Ohka Kogyo Co.,Ltd. under the trade name "TOPR-1000") was applied to the film by spin coating at a number of revolutions of 3000 rpm for a revolution time of 20 seconds. Then, the coated substrate was dried on a hot plate at 110° C. for 90 seconds, and then was exposed to light with gamma ray at an irradiation power of 500 mw/cm² for 1 second, followed by development.

Subsequently, etching was carried out for 50 minutes by means of a plasma etcher as a dry etching apparatus, using a mixed gas containing $CF_4$, $CHF_3$, and Ar at flow rates of 24, 24, and 98 SCCm, respectively at a plasma output of 300 W under a vacuum degree of 0.5 Torr.

Then the cross section of the specimen was observed in the same manner as in Example 2. As a result, the value: {(width of the lower section)–(width of the upper section)}/(height) was $\frac{1}{10}$.

EXAMPLE 5

Preparation of Inter-Insulator Layer of Inversely Tapered Type

ZCOAT-1410(photosensitive polyolefin-based nagative type resist, produced by Nippon Zeon Co.,Ltd.) was made into a film by spin coating on a glass substrate 2 with a thickness of 0.5 mm holding an ITO as the lower electrode which had been subjected to striped processing at a pitch of 300 μm. The spin coating was carried out at a number of revolutions of 1000 rpm for a revolution time of 40 seconds. The film thus obtained had a thickness of 8.8 μm.

Subsequently, the film-coated substrate was baked in a hot oven at 80° C. for 15 miniutes, and then was exposed to light through a photomask at an irradiation power of 450 mJ/cm$^2$ with ultraviolet ray with a wavelength of 365 nm. The exposure pattern was carried out so that an inter-insulator layer having a width of 50 μm remains at a pitch of 350 μm as linear lines perpendicularly to the pattern of the aforesasid ITO pattern. After development, curing was put into practice at 200° C. for 1 hour in a clean oven to prepare an inter-insulator layer.

Then the cross section of the specimen was observed by means of a scanning electron microscope in the same manner as in Example 2. As a result, the value: {(width of the lower section)–(width of the upper section)}/(height) was negative, and the cross section was in an inversely tapered form as shown in FIG. 10 (b) or (c) throughout all of the observed cross sections.

EXAMPLE 6

Preparation of Organic EL Element and Evaluation of Precision and Minuteness Thereof By the use of the specimen which had been prepared in Example 5, an organic EL element was prepared in the same manner as in Example 3. The pattern precision was evaluated in the same manner as in Example 3. As the result, the pattern precision was ±4 μm, and it was confirmed that the pattern was free from any short-circuited connection part in the stripe lines of Mg:Ag, thereby demonstrating the favorable patterning method.

EXAMPLE 7

Preparation of Organic EL Element and Evaluation of Precision and Minuteness Thereof SiO$_2$ was made into a film with a thickness of 1 μm by a plasma-enhanced CVD method on a glass substrate 2 with a thickness of 0.5 mm holding an ITO as the lower electrode which had been subjected to striped processing at a pitch of 300 μm . The film formation conditions were set to a substrate temperature of 250° C., a vacuum degree of 0.7 Torr, and a plasma output of 200 W, using a mixed gas of N$_2$O and SiH$_4$ (1:1) as the plasma gas species.

Thereafter in the same manner as in Example 4, a positive type photoresist (produced by Tokyo Ohka Kogyo Co., Ltd. under the trade name "TOPR-1000") was made into a film, followed by exposure to light and development so as to leave a pattern in which opening lines are provided perpendicularly to the ITO that had been subjected to striped processing as mentioned hereinbefore. The opening lines had a width of 280 μm and a pitch of 300 μm.

Subsequently, the SiO$_2$ at the opening portion of the photoresist was completely removed by plasma etching so that the surface of the ITO was exposed. The SiO$_2$ etching was carried out, using a mixed gas of CF$_4$, CHF$_3$, and Ar (ratio by volume of 1:1:3.5) as the plasma gas species at a vacuum degree of 0.5 Torr, and a plasma output of 300 W. The SiO$_2$ that was used as the inter-insulator layer had an extremely low coefficient of water absorption as low as 0.01% or lower.

Thereafter an organic EL element was prepared in the same manner as in Example 3, and was evaluated. As the result, there were obtained favorable pattern precision of only 1 μm or less, and also favorable patterning of the counter electrode.

EXAMPLE 8

Preparation of Organic EL Element and Evaluation of Precision and Minuteness Thereof SiO$_x$(x=1.8) was made into a film with a thickness of 300 nm by sputtering method on a glass substrate 2 with a thickness of 0.5 mm holding an ITO as the lower electrode which had been subjected to striped processing at a pitch of 300 μm.

Thereafter in the same manner as in Example 4, a positive type photoresist (produced by Tokyo Ohka Kogyo Co.,Ltd. under the trade name "TOPR-1000") was made into a film, followed by exposure to light and development so as to leave a pattern in which opening lines are provided perpendicularly to the ITO that had been subjected to striped processing as mentioned hereinbefore. The opening lines had a width of 280 μm and a pitch of 350 μm.

Then the photoresist along with the substrate was heated to 150° C. so that the cross section of the photoresist was made into a semicylindrical shape.

Subsequently, etching was carried out with a plasma etcher under the etching conditions including a mixed gas of CF$_4$, CHF$_3$, and Ar (ratio by volume of 1:1:8) as the plasma gas species, a vacuum degree of 0.2 Torr, and a plasma output of 200 W.

Thereafter the photoresist was peeled off, and a first inter-insulator layer was prepared. The aforesaid photoresist having a cross section in a semicylindrical shape was intended to render the cross section of the first inter-insulator layer trapezoidal. Further the SiO$_x$ was processed into a trapezoidal shape through a plasma etching method.

After the aforesaid step, ZCOAT-1410 was made into a film on the above-mentioned first inter-insulator layer in the same manner as in Example 5 to prepare a second inter-insulator layer. Both the first inter-insulator layer and the second inter-insulator layer had an extremely low coefficient of water absorption as low as 0.01% or lower.

Thereafter an organic EL element was prepared in the same manner as in Example 3, and was evaluated. As a result, there were obtained favorable pattern precision of only 1 μm or less, and also favorable patterning of the counter electrode.

INDUSTRIAL APPLICABILITY

The organic EL element according to the present invention is an excellent organic electroluminescent element which is highly precise and minute, uniform in light emission, free from cross talk, resistant to external pressure, and further excellent in sealing properties.

Thus, the organic EL element according to the present invention is well suited to use for a display which is highly precise and minute, and uniform in light emission such as OA equipment and machinery, clocks and watches.

What is claimed is:

1. An organic electroluminescent element 1 that is equipped, between a lower electrode 3 and a counter electrode 4 each on a substrate 2, with:

an intervening organic layer 5 comprising a light-emitting layer, which element 1 comprises an inter-insulator layer 6 having a coefficient of water adsorption of at most 0.1% in a non-light-emitting element portion;

step portions 9 in said inter-insulator layer 6, said step portion 9 defining the boundary between a light-emitting element portion and a non-light-emitting element portion and containing rising parts almost perpendicular to the surface of said lower electrode 3; and a sealing plate or a sealing lid 7 which is placed over said inter-insulator layer 6 which is attached to said substrate 2 via an adhesive layer 8.

2. The organic electroluminescent element 1 according to claim 1, wherein a space encompassed by the sealing plate 7 and the substrate 2 is filled in with a fluorinated hydrocarbon as a sealing liquid.

3. The organic electroluminescent element 1 according to claim 1, wherein a space encompassed by the sealing plate 7 and the substrate 2 comprises a moisture absorbing agent.

4. The organic electroluminescent element 1 according to claim 1, wherein a moisture absorbing layer is placed on the inner side of the sealing plate 7 and/or the outer side which is in contact with the outside of the organic EL element.

5. The organic electroluminescent element 1 according to claim 1, wherein a space encompassed by the sealing plate 7 and the substrate 2 comprises a sealing gas selected from the group of dehydrated nitrogen, carbon dioxide and helium.

6. The organic electroluminescent element 1 according to claim 1, comprising a color filter placed on a sealing plate 7.

7. The organic electroluminescent element 1 according to claim 1, comprising a color filter placed in the sealing plate 7 and above the counter electrode 4.

8. The organic electroluminescent element 1 according to claim 1, comprising a color conversion film placed on the sealing plate 7.

9. The organic electroluminescent element 1 according to claim 1, comprising a color conversion film placed in the sealing plate 7 and above the counter electrode 4.

10. The organic electroluminescent element 1 according to claim 1, wherein the organic electroluminescent element 1 is addressed by an active matrix.

11. An organic electroluminescent element 1 that is equipped, between a lower electrode 3 and a counter electrode 4 each on a substrate 2, with:

an intervening organic layer 5 comprising a light-emitting layer, which element 1 comprises an inter-insulator layer 6 having a coefficient of water adsorption of at most 0.1% in a non-light-emitting element portion;

step portions 9 in said inter-insulator layer 6, said step portions 9 containing portions rising in the form of an inverse taper almost perpendicularly to the surface of the lower electrode 3 and dividing said counter electrode 4 into a plurality of individuals; and a sealing plate or a sealing lid 7 which is placed over said inter-insulator layer 6 and which is attached to said substrate 2 via an adhesive layer 8.

12. The organic electroluminescent element 1 according to claim 11, wherein a space encompassed by the sealing plate 7 and the substrate 2 is filled in with a fluorinated hydrocarbon as a sealing liquid.

13. The organic electroluminescent element 1 according to claim 11, wherein a space encompassed by the sealing plate 7 and the substrate 2 comprises a moisture absorbing agent.

14. The organic electroluminescent element 1 according to claim 11, wherein a moisture absorbing layer is placed on the inner side of the sealing plate 7 and/or the outer side which is in contact with the outside of the organic EL element.

15. The organic electroluminescent element 1 according to claim 11, wherein a space encompassed by the sealing plate 7 and the substrate 2 comprises a sealing gas selected from the group of dehydrated nitrogen, carbon dioxide and helium.

16. The organic electroluminescent element 1 according to claim 11, comprising a color filter placed on a sealing plate 7.

17. The organic electroluminescent element 1 according to claim 11, comprising a color filter placed in the sealing plate 7 and above the counter electrode 4.

18. The organic electroluminescent element 1 according to claim 11, comprising a color conversion film placed on the sealing plate 7.

19. The organic electroluminescent element 1 according to claim 11, comprising a color conversion film placed in the sealing plate 7 and above the counter electrode 4.

20. The organic electroluminescent element 1 according to claim 11, wherein the organic electroluminescent element 1 is addressed by an active matrix.

21. An organic electroluminescent element 1 that is equipped, between a lower electrode 3 and a counter electrode 4 each on a substrate 2, with:

an intervening organic layer 5 comprising a light-emitting layer, which element 1 comprises a first inter-insulator layer having a trapezoidal cross section 15 on said lower electrode 3 as a non-light-emitting element portion;

a second inter-insulator layer 14 above said trapezoidal cross section;

step portions 9 in said second inter-insulator layer 14, said step portions 9 containing rising parts almost perpendicular to the surface of the lower electrode 3 and dividing said counter electrode 4 into a plurality of individuals; and a sealing plate or a sealing lid 7 which is placed over said second inter-insulator layer 14 and which is attached to said substrate 2 via an adhesive layer 8.

22. The organic electroluminescent element 1 according to claim 21, wherein a space encompassed by the sealing plate 7 and the substrate 2 is filled in with a fluorinated hydrocarbon as a sealing liquid.

23. The organic electroluminescent element 1 according to claim 21, wherein a space encompassed by the sealing plate 7 and the substrate 2 comprises a moisture absorbing agent.

24. The organic electroluminescent element 1 according to claim 21, wherein a moisture absorbing layer is placed on the inner side of the sealing plate 7 and/or the outer side which is in contact with the outside of the organic EL element.

25. The organic electroluminescent element 1 according to claim 21, wherein a space encompassed by the sealing plate 7 and the substrate 2 comprises a sealing gas selected from the group of dehydrated nitrogen, carbon dioxide and helium.

26. The organic electroluminescent element 1 according to claim 21, comprising a color filter placed on a sealing plate 7.

27. The organic electroluminescent element 1 according to claim 21, comprising a color filter placed in the sealing plate 7 and above the counter electrode 4.

28. The organic electroluminescent element 1 according to claim 21, comprising a color conversion film placed on the sealing plate 7.

29. The organic electroluminescent element 1 according to claim 21, comprising a color conversion film placed in the sealing plate 7 and above the counter electrode 4.

30. The organic electroluminescent element 1 according to claim 21, wherein the organic electroluminescent element 1 is addressed by an active matrix.

31. A process for producing an organic electroluminescent element 1, comprising at least one step of forming a lower electrode 3 on a substrate 2; a step of forming a patterned inter-insulator layer on said lower electrode 3, a step of forming an organic layer over said lower electrode 3, and at least one step of forming a counter electrode 4 in the form of film, so that a first inter-insulator layer 15 has a trapezoidal cross section, a second inter-insulator layer 14 is mounted above said trapezoidal cross section, step portions 9 in said second inter-insulator layer 14 contain rising parts almost perpendicular to the surface of said lower electrode 3, and said counter electrode 4 is subjected to patterning processing at said rising part.

* * * * *